(12) United States Patent
Pasotti et al.

(10) Patent No.: US 12,401,264 B2
(45) Date of Patent: Aug. 26, 2025

(54) VOLTAGE REGULATOR CIRCUIT FOR A SWITCHING CIRCUIT LOAD

(71) Applicant: STMicroelectronics S.r.l., Agrate Brianza (IT)

(72) Inventors: Marco Pasotti, Travaco' Siccomario (IT); Laura Capecchi, Vedano al Lambro (IT); Riccardo Zurla, Binasco (IT); Marcella Carissimi, Treviolo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/746,752

(22) Filed: Jun. 18, 2024

(65) Prior Publication Data

US 2024/0339917 A1    Oct. 10, 2024

Related U.S. Application Data

(63) Continuation of application No. 17/582,431, filed on Jan. 24, 2022, now Pat. No. 12,046,987.

(51) Int. Cl.
*H02M 1/00* (2007.01)
*G05F 1/575* (2006.01)
(Continued)

(52) U.S. Cl.
CPC .......... *H02M 1/0045* (2021.05); *G05F 1/575* (2013.01); *H02M 3/073* (2013.01); *G11C 13/0004* (2013.01); *G11C 13/0038* (2013.01)

(58) Field of Classification Search
CPC ...... H02M 1/0045; H02M 3/07; H02M 3/076; G05F 1/56; G05F 1/575
See application file for complete search history.

(56) References Cited

U.S. PATENT DOCUMENTS 5,689,460 A  *  11/1997  Ooishi ................... G11C 5/143
                                                          327/535
7,764,525 B2    7/2010  Hsieh et al.
(Continued)

FOREIGN PATENT DOCUMENTS

CN          114253333 A      3/2022
EP            3410251 A1     12/2018

OTHER PUBLICATIONS

EPO Search Report and Written Opinion for counterpart EP Appl. No. 23151962, report dated Jun. 7, 2023, 10 pgs.
(Continued)

*Primary Examiner* — Thienvu V Tran
*Assistant Examiner* — Yahveh Comas Torres
(74) *Attorney, Agent, or Firm* — Crowe & Dunlevy LLC

(57) ABSTRACT

A voltage regulator receives a reference voltage and generates a regulated voltage using a MOSFET having a gate terminal configured to receive a control voltage. A charge pump receives the regulated voltage and generates a charge pump voltage in response to an enable signal and a clock signal generated in response to the enable signal. The voltage regulator further includes a first switched capacitor circuit coupled to the gate terminal and configured to selectively charge a first capacitor with a first current and impose a first voltage drop on the control voltage in response to assertion of the enable signal. The voltage regulator also includes a second switched capacitor circuit coupled to the gate terminal and configured to selectively charge a second capacitor with a second current and impose a second voltage drop on the control voltage in response to one logic state of the clock signal.

8 Claims, 3 Drawing Sheets

(51) Int. Cl.
*H02M 3/07* (2006.01)
*G11C 13/00* (2006.01)

(56) References Cited

U.S. PATENT DOCUMENTS

| | | | |
|---|---|---|---|
| 7,965,067 B2 | 6/2011 | Gronthal et al. | |
| 8,519,692 B2 * | 8/2013 | Nakashima | G05F 1/56 |
| | | | 323/288 |
| 9,778,672 B1 * | 10/2017 | Gao | G05F 1/575 |
| 10,243,456 B2 | 3/2019 | Pelicia et al. | |
| 10,423,178 B1 | 9/2019 | Chen | |
| 10,491,114 B1 * | 11/2019 | Zhang | G05F 1/462 |
| 10,571,945 B2 | 2/2020 | Pishdad | |
| 10,860,043 B2 | 12/2020 | Hung et al. | |
| 11,641,159 B1 * | 5/2023 | Englekirk | H02M 3/07 |
| | | | 327/536 |
| 2002/0030534 A1 | 3/2002 | Myono | |
| 2005/0030088 A1 * | 2/2005 | Cernea | G11C 5/145 |
| | | | 327/536 |
| 2010/0253301 A1 * | 10/2010 | Nakada | H02M 1/08 |
| | | | 331/172 |
| 2011/0089916 A1 * | 4/2011 | Soenen | G05F 1/575 |
| | | | 323/280 |
| 2011/0156670 A1 * | 6/2011 | Tadeparthy | G05F 1/56 |
| | | | 323/273 |
| 2013/0148456 A1 * | 6/2013 | Cho | G11C 5/145 |
| | | | 365/226 |
| 2019/0025861 A1 * | 1/2019 | Hung | G05F 1/465 |
| 2021/0405674 A1 | 12/2021 | Xue et al. | |

OTHER PUBLICATIONS

Dickson, John F.: "On-Chip High-Voltage Generation in MNOS Integrated Circuits Using an Improved Voltage Multiplier Technique," IEEE Journal of Solid-State Circuits, vol. SC-11, No. 3, pp. 374-377, Jun. 1976.

* cited by examiner

VOLTAGE REGULATOR CIRCUIT FOR A SWITCHING CIRCUIT LOAD

CROSS-REFERENCE TO RELATED APPLICATIONS

This application is a continuation of U.S. application for patent Ser. No. 17/582,431, filed Jan. 24, 2022, the disclosure of which is incorporated by reference.

TECHNICAL FIELD

The present invention generally relates to a voltage regulator circuit and, in particular, to a low drop out (LDO) voltage regulator circuit.

BACKGROUND

FIG. 1 shows a circuit diagram for a conventional voltage regulator circuit 10 of the low drop out (LDO) type. The circuit includes a differential amplifier circuit 12 (functioning as an error amplifier), a metal oxide semiconductor field effect transistor (MOSFET) device 14 and a feedback circuit 16. An inverting (−) input of the differential amplifier circuit 12 is coupled to receive a reference voltage Vref generated, for example, by a bandgap voltage generator circuit (i.e., Vref=Vbg). A non-inverting (+) input of the differential amplifier circuit 12 is coupled to receive a feedback voltage Vfb output by the feedback circuit 16. The differential amplifier circuit 12 is powered from a power supply node Vdd referenced to a ground node and generates a control voltage Vctrl dependent on an amplified difference between the voltages Vref and Vfb. The MOSFET device 14 is a p-channel type device (pMOS transistor) having a source terminal coupled, preferably connected, to the power supply node to receive the supply voltage Vdd, a gate terminal coupled, preferably connected, to an output of the differential amplifier circuit 12 to receive the control voltage Vctrl, and a drain coupled, preferably connected, to an output node 18 where a regulated output voltage Vreg is generated and applied to a load circuit 20. The feedback circuit 16 is formed by a resistive voltage divider circuit including a first resistor R1 coupled, preferably connected, in series at a feedback node 22 to a second resistor R2. The first resistor R1 is coupled, preferably connected, to the output node 18 and the second resistor R2 is coupled, preferably connected, to the ground node. The feedback voltage Vfb is generated at the feedback node 22 which is coupled, preferably connected, to the non-inverting (+) input of the differential amplifier circuit 12.

There exist a number of applications where voltage regulator circuit 10 supplies the regulated output voltage Vreg to a load circuit 20 which operates in a manner where large amplitude current spikes are sunk to ground. An example of such a load circuit 20 is a charge pump that is operating to convert the regulated output voltage Vreg to a pumped output voltage Vcp. A large amplitude current is sourced in response to switching operations of a pump capacitor in the charge pump circuit to the output node 18. Another example of such a load circuit 20 is a switched mode DC-DC converter. The voltage regulator circuit 10 must generate a stable regulated output voltage Vreg for the load circuit 20 notwithstanding the changes in the instantaneous transient current needs of the load circuit 20.

One solution is to install a large capacitance filtering capacitor coupled between the output node 20 and ground to smooth the regulated output voltage Vreg. In many integrated circuit applications, however, this solution is not acceptable because of the large amount of integrated circuit area that is occupied by the filtering capacitor.

Another solution is to bias the output stage of the error amplifier with a larger quiescent current. In many integrated circuit applications, however, this solution is not acceptable because the larger quiescent current corresponds to an undesired increase in power consumption.

Guaranteeing both a sufficiently low output voltage drop and a small quiescent current presents a significant challenge for designing the voltage regulator circuit for supplying a regulated output voltage to a load circuit which sinks large amplitude current spikes.

There is a need in the art to address the foregoing problems with conventional voltage regulator circuits.

SUMMARY

In an embodiment, a voltage generator circuit comprises: a voltage regulator circuit configured to receive a reference voltage and generate a regulated output voltage, said voltage regulator circuit including a metal oxide field effect transistor (MOSFET) device having a gate terminal configured to receive a control voltage and a drain terminal configured to source an output current for generating the regulated output voltage; and a charge pump circuit configured to receive the regulated output voltage and generate a charge pump output voltage, said charge pump circuit controlled for operation by an enable signal and a clock signal, wherein the clock signal is generated in response to the enable signal. The voltage regulator circuit includes: a first switched capacitor circuit coupled to the gate terminal and configured to selectively charge a first capacitor with a first current and impose a first voltage drop on the control voltage in response to assertion of the enable signal; and a second switched capacitor circuit coupled to the gate terminal and configured to selectively charge a second capacitor with a second current and impose a second voltage drop on the control voltage in response to one logic state of the clock signal.

In an embodiment, a circuit comprises: a voltage regulator circuit configured to receive a reference voltage and generate a regulated output voltage, said voltage regulator circuit including a metal oxide field effect transistor (MOSFET) device having a gate terminal configured to receive a control voltage and a drain terminal configured to source an output current for generating the regulated output voltage; and a load circuit configured to receive the regulated output voltage, said load circuit subject to transient current spiking in response to a load circuit control signal. The voltage regulator circuit further includes a switched capacitor circuit coupled to the gate terminal and configured to selectively charge a capacitor with a charging current and impose a voltage drop on the control voltage in response to assertion of the load circuit control signal.

BRIEF DESCRIPTION OF THE DRAWINGS

For a better understanding of the embodiments, reference will now be made by way of example only to the accompanying figures in which.

DETAILED DESCRIPTION

Figure 1:
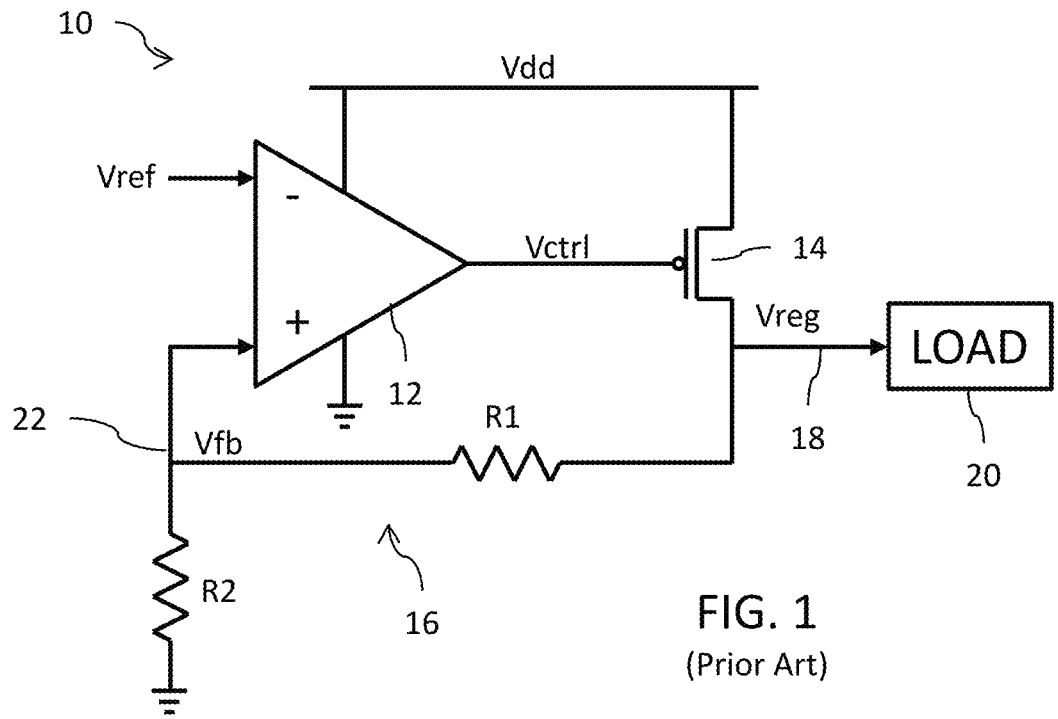
FIG. 1 is a circuit diagram of a conventional low drop out (LDO) type voltage regulator circuit driving a load circuit.
Figure 2:
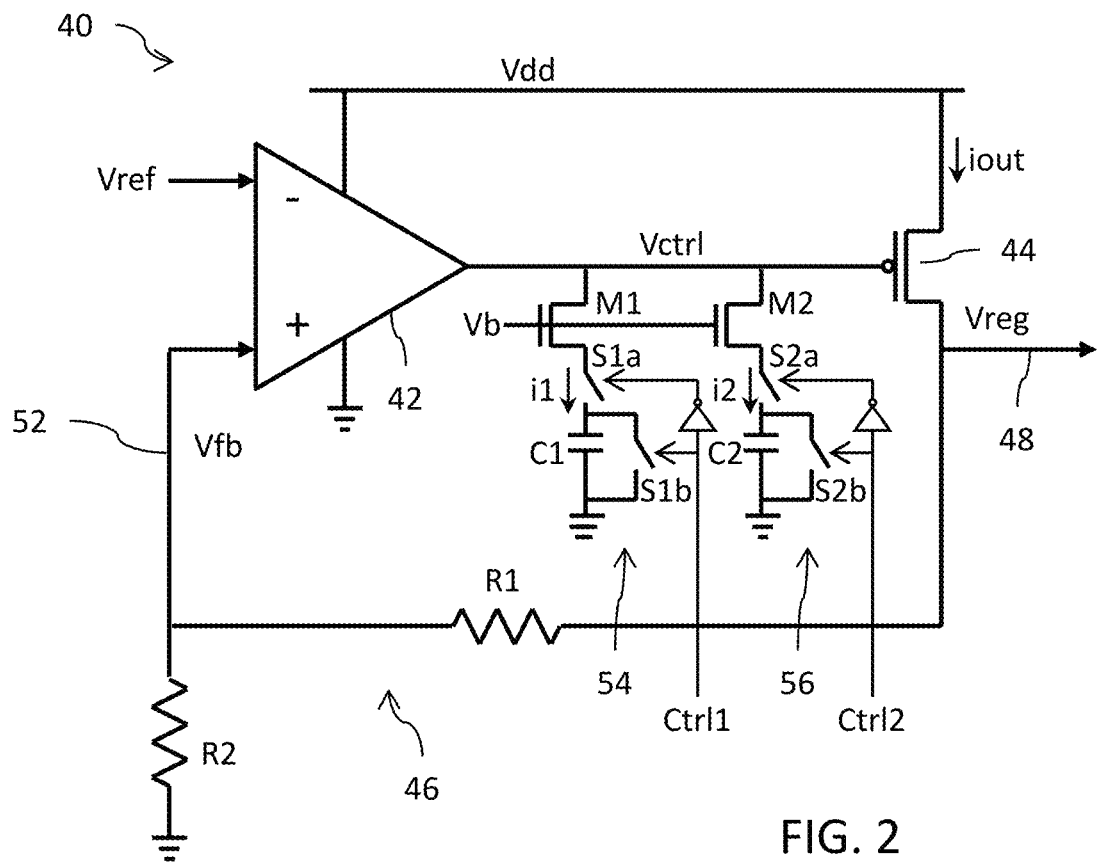
FIG. 2 is a circuit diagram of an embodiment for an LDO type voltage regulator circuit.

Reference is now made to FIG. 2 which shows a circuit diagram of an embodiment for an LDO type voltage regulator circuit 40. The circuit includes a differential amplifier circuit 42 (functioning as an error amplifier), a metal oxide semiconductor field effect transistor (MOSFET) device 44 and a feedback circuit 46. An inverting (−) input of the differential amplifier circuit 42 is coupled to receive a reference voltage Vref generated, for example, by a bandgap voltage generator circuit (i.e., Vref=Vbg). A non-inverting (+) input of the differential amplifier circuit 42 is coupled to receive a feedback voltage Vfb output by the feedback circuit 46. The differential amplifier circuit 42 is powered from a power supply node Vdd referenced to a ground node and generates a control voltage Vctrl dependent on an amplified difference between the voltages Vref and Vfb. The MOSFET device 44 is a p-channel type device (pMOS transistor) having a source terminal coupled, preferably connected, to the power supply node to receive the supply voltage Vdd, a gate terminal coupled, preferably connected, to an output of the differential amplifier circuit 42 to receive the control voltage Vctrl, and a drain coupled, preferably connected, to an output node 48 where a regulated output voltage Vreg is generated for application to a load circuit (not shown here, see FIG. 5 reference 102). The feedback circuit 46 is formed by a resistive voltage divider circuit including a first resistor R1 coupled, preferably connected, in series at a feedback node 52 to a second resistor R2. The first resistor R1 is coupled, preferably connected, to the output node 48 and the second resistor R2 is coupled, preferably connected, to the ground node. The feedback voltage Vfb is generated at the feedback node 52 which is coupled, preferably connected, to the non-inverting (+) input of the differential amplifier circuit 42.

The voltage regulator circuit 40 further includes a first switched capacitor circuit 54 coupled between the gate terminal of the MOSFET device 44 and ground. This first switched capacitor circuit 54 includes a first capacitor C1 coupled in series with a first switch S1a and a first voltage limiting circuit M1 between the gate terminal of the MOSFET device 44 and ground. The first voltage limiting circuit M1 may, for example, be implemented by a MOSFET device that comprises an n-channel type device (nMOS transistor) having a drain terminal coupled, preferably connected, to the gate terminal of the MOSFET device 44, a gate terminal biased by a bias voltage Vb (so that the nMOS transistor has a desired drain-to-source resistance), and a source terminal coupled, preferably connected, to a first terminal of the first switch S1a. A second terminal of the first switch S1a is coupled, preferably connected, to a first terminal of the first capacitor C1. A second terminal of the first capacitor C1 is coupled, preferably connected, to ground. The first switched capacitor circuit 54 further includes a second switch S1b coupled, preferably connected, in parallel with the first capacitor C1.

The actuation (closing) and deactuation (opening) of the first and second switches S1a and S1b are inversely controlled in response to the logic state of a first control signal Ctrl1. Specifically, first switch S1a is open and second switch S1b is closed in response to a first logic state (for example, deassertion) of signal Ctrl1, and conversely first switch S1a is closed and second switch S1b is open in response to a second logic state (for example, assertion) of signal Ctrl1. The first and second switches S1a and S1b may, for example, be implemented by MOSFET devices. A control terminal of the second switch S1b is driven by control signal Ctrl1 and a control terminal of the first switch S1a is driven by a logical inverse of the control signal Ctrl1 generated by an inverter circuit. When control signal Ctrl1 is in the first logic state, the second switch S1b is closed (with the first switch S1a open), and the first capacitor C1 is discharged to ground and the amplifier 42 sets the control voltage Vctrl for the MOSFET device 44 in response to the comparison of the voltages Vref and Vfb. When control signal Ctrl1 is in the second logic state, the first switch S1a is closed (with the second switch S1b open), the first capacitor C1 is coupled to the gate terminal of the MOSFET device 44 through the first voltage limiting circuit M1 and a first current i1 flows discharging the gate terminal of the MOSFET device 44 and charging the first capacitor C1. There is a corresponding decrease in the control voltage Vctrl causing the MOSFET device 44 to turn on harder and source more output current iout to the output node 48 than would otherwise be provided in response to the comparison of the voltages Vref and Vfb performed by amplifier 42 in setting the level of the control voltage Vctrl. The total amount of charge drawn by capacitor C1 is equal to C1 (Vb−Vth), wherein Vth is the threshold voltage of the nMOS transistor forming the first voltage limiting circuit M1.

The voltage regulator circuit 40 further includes a second switched capacitor circuit 56 coupled between the gate terminal of the MOSFET device 44 and ground. This second switched capacitor circuit 56 includes a second capacitor C2 coupled in series with a third switch S2a and a second voltage limiting circuit M2 between the gate terminal of the MOSFET device 44 and ground. The second voltage limiting circuit M2 may, for example, be implemented by a MOSFET device that comprises an n-channel type device (nMOS transistor) having a drain terminal coupled, preferably connected, to the gate terminal of the MOSFET device 44, a gate terminal biased by the bias voltage Vb (so that the nMOS transistor has a desired drain-to-source resistance), and a source terminal coupled, preferably connected, to a first terminal of the third switch S2a. A second terminal of the third switch S2a is coupled, preferably connected, to a first terminal of the second capacitor C2. A second terminal of the second capacitor C2 is coupled, preferably connected, to ground. The second switched capacitor circuit 56 further includes a fourth switch S2b coupled, preferably connected, in parallel with the second capacitor C2.

The actuation (closing) and deactuation (opening) of the third and fourth switches S2a and S2b are inversely controlled in response to the logic state of a second control signal Ctrl2. Specifically, third switch S2a is open and fourth switch S2b is closed in response to a first logic state (for example, deassertion) of signal Ctrl2, and conversely third switch S2a is closed and fourth switch S2b is open in response to a second logic state (for example, assertion) of signal Ctrl2. The third and fourth switches S2a and S2b may, for example, be implemented by MOSFET devices. A control terminal of the fourth switch S2b is driven by control signal Ctrl2 and a control terminal of the third switch S2a is driven by a logical inverse of the control signal Ctrl2 generated by an inverter circuit. When control signal Ctrl2 is in the first logic state, the fourth switch S2b is closed (with the third switch S2a open), and the second capacitor C2 is discharged to ground, and the amplifier 42 sets the control voltage Vctrl for the MOSFET device 44 in response to the comparison of the voltages Vref and Vfb. When control signal Ctrl2 is in the second logic state, the third switch S2a is closed (with the fourth switch S2b open), the second capacitor C2 is coupled to the gate terminal of the MOSFET device 44 through the second voltage limiting circuit M2 and a second current i2 flows discharging the gate terminal of the MOSFET device 44 and charging the second capacitor C2. There is a corresponding decrease in the control voltage Vctrl causing the MOSFET device 44 to turn on harder and source more output current iout to the output node 48 than would otherwise be provided in response to the comparison of the voltages Vref and Vfb performed by amplifier 42 in setting the level of the control voltage Vctrl.

The capacitances of the first and second capacitors C1 and C2 may be different. In particular, the capacitances may be sized in accordance with operational needs so that the first and second switched capacitor circuits 54 and 56 impose different degrees of decrease in the control voltage Vctrl responsive to the first and second control signals Ctrl1 and Ctrl2 being in the second logic state. An example of this is described in more detail below in connection with FIG. 5.

Figure 3:
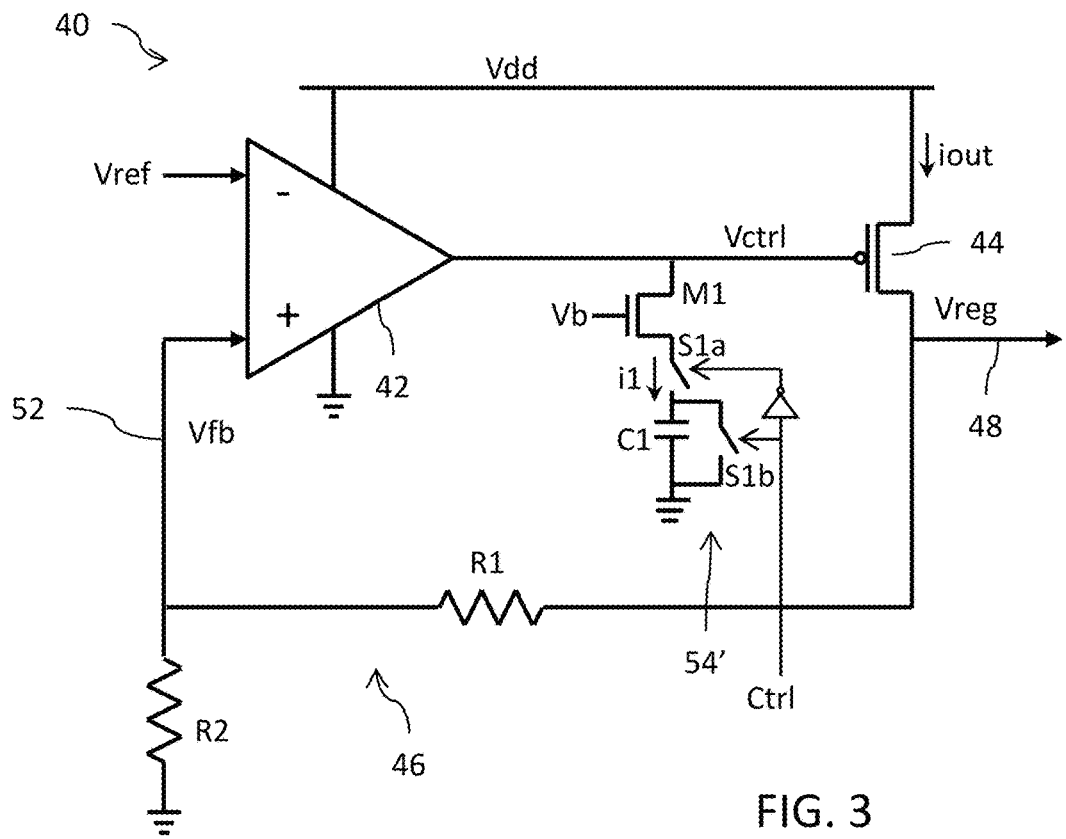
FIG. 3 is a circuit diagram of an alternative embodiment for an LDO type voltage regulator circuit.

In an embodiment, only one switched capacitor circuit 54', instead of both the first and second switched capacitor circuits 54 and 56, need be included in the regulator 40 as shown in FIG. 3. Switch S1a and S1b actuation in this switched capacitor circuit 54' is controlled by control signal Ctrl.

Figure 4:
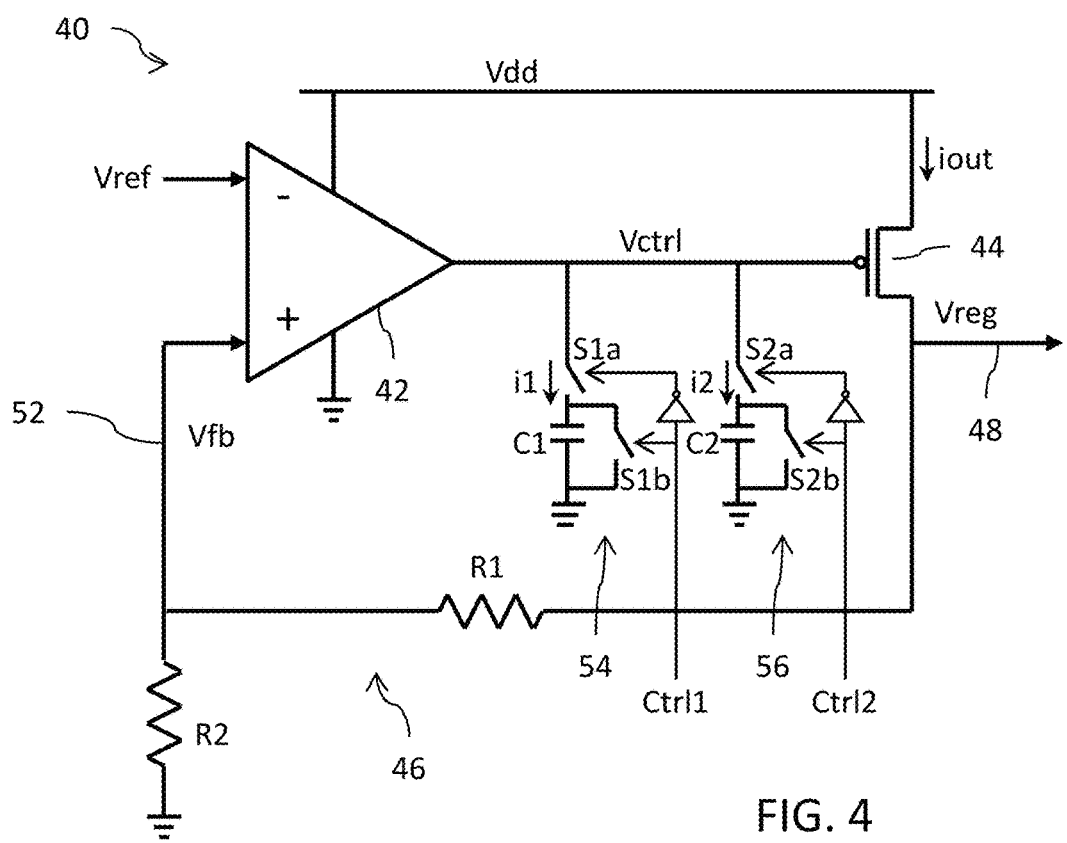
FIG. 4 is a circuit diagram of an alternative embodiment for an LDO type voltage regulator circuit.

In an alternate embodiment, as shown in FIG. 4, the first and second voltage limiting circuits M1 and M2 may be omitted from the regulator 40.

Although illustrated in the context of an LDO type voltage regulator, the switched capacitor circuit 54' (FIG. 3), or both the first and second switched capacitor circuits 54 and 56 (FIGS. 2 and 4), may be utilized at the gate terminal of the output MOSFET transistor for other types of voltage regulator circuits.

Figure 5:
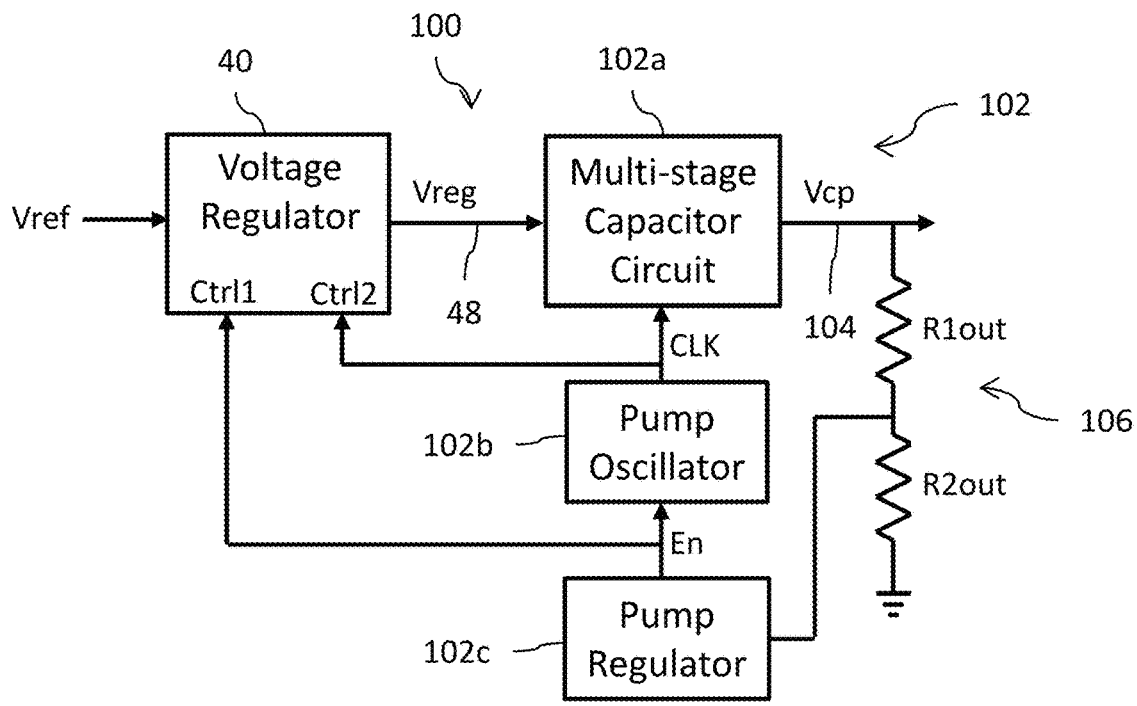
FIG. 5 is block diagram of a voltage supply circuit.

Reference is now made to FIG. 5 which shows a block diagram of a voltage supply circuit 100 including the voltage regulator 40 (like that shown in FIGS. 2 and 4, for example) coupled to a load circuit 102 formed by a voltage charge pump (CP) circuit. The CP circuit includes a multi-stage (i.e., one or more stages) capacitor circuit 102a having a voltage input node configured to receive the regulated output voltage Vreg from the voltage regulator 40 and a voltage output node 104 configured to generate a charge pump output voltage Vcp which is higher than the regulated output voltage Vreg. The multi-stage capacitor circuit 102a further includes a control input configured to receive a clock signal CLK. An example of such a multi-stage capacitor circuit 102a, without limitation or restriction, is a Dickson-type circuit well known to those skilled in the art where each stage includes two capacitors driven by opposite phases of the clock signal CLK corresponding to a charge input phase and a charge transfer phase. Another example of such a multi-stage capacitor circuit 102a, without limitation or restriction, is voltage doubler-type circuit also well known to those skilled in the art where opposite phases of the clock signal CLK drive switching operations for a charge input phase where a flying capacitor is charged and a charge transfer phase where charge from the flying capacitor is transferred to an output capacitor.

The clock signal CLK is generated by an oscillator circuit 102b. It will be understood that the clock signal CLK generated by the oscillator circuit 102b may be processed to generate multiple clock phases as needed to control the multi-stage capacitor circuit 102a. The oscillator circuit 102b is selectively enabled for operation in response to an enable signal En that is generated by a regulator circuit 102c. The regulator circuit 102c is coupled through a feedback circuit 106 to sense the charge pump output voltage Vcp at output node 104. The feedback circuit 106 is formed by a resistive voltage divider circuit including a first resistor R1out coupled, preferably connected, in series at a feedback node to a second resistor R2out. The first resistor R1out is coupled, preferably connected, to the output node 104 and the second resistor R2out is coupled, preferably connected, to the ground node. The sensed output voltage is generated at the feedback node and applied to the regulator circuit 102c. If the regulator circuit detects that the charge pump output voltage Vcp is above the threshold level, the enable signal En is driven to a first logic state which controls the oscillator circuit 102b to turn off and terminate output of the clock signal CLK. Conversely, if the regulator circuit detects through the sensed voltage that the charge pump output voltage Vcp is below some threshold level, the enable signal En is driven to a second logic state which controls the oscillator circuit 102b to turn on and generate output of the clock signal CLK. Responsive to the oscillation of the clock signal CLK, the multi-stage capacitor circuit 102a boosts the regulated voltage Vreg to increase the level of the charge pump voltage Vcp.

The enable signal En of the charge pump circuit is applied to the voltage regulator 40 as the first control signal Ctrl1. When the enable signal En (first control signal Ctrl1) is in the first logic state corresponding to turning off the oscillator circuit 102b, the second switch S1b of the first switched capacitor circuit 54 in the voltage regulator 40 is closed (with the first switch S1a open), and the first capacitor C1 is discharged to ground. However, when the enable signal En (first control signal Ctrl1) is the second logic state corresponding to turning on the oscillator circuit 102b, the first switch S1a of the first switched capacitor circuit 54 in the voltage regulator 40 is closed (with the second switch S1b open), and the first current i1 flows from the gate terminal of MOSFET device 44 to charge the first capacitor C1. As a result, there is a drop in the gate voltage and additional current is sourced by MOSFET 44 to the regulator output to hold the regulator output voltage Vreg in response to the current spike to the load 102 which can occur during startup of the charge pump circuit.

The clock signal CLK is applied to the voltage regulator 40 as the second control signal Ctrl2. When the clock signal CLK (second control signal Ctrl2) is the first logic state, the fourth switch S2b of the second switched capacitor circuit 56 in the voltage regulator 40 is closed (with the third switch S2a open), and the second capacitor C2 is discharged to ground. However, when the clock signal CLK (second control signal Ctrl2) is the second logic state, the third switch S2a of the second switched capacitor circuit 56 in the voltage regulator 40 is closed (with the fourth switch S2b open), and the second current i2 flows from the gate terminal of MOSFET device 44 to charge the second capacitor C2. As a result, there is a drop in the gate voltage in response to the second logic state (phase) of the clock signal CLK and additional current is sourced by MOSFET 44 to the regulator output to hold the regulator output voltage Vreg in response to the current spike to the load 102 which can occur in response to switching operation of the charge pump circuit.

With reference once again to the issue of choosing capacitance values for the first and second capacitors C1 and C2, it will be noted that the current demand of the load 102 at startup of the charge pump circuit is likely to be greater than the current demand of the load at each charge input phase. Because of this, it would be advantageous to choose a capacitance for the first capacitor C1 that is larger than the capacitance of the second capacitor C2. In view of the larger capacitance for capacitor C1, there will be a correspondingly larger drop in the voltage at the gate terminal of MOSFET device 44 causing the MOSFET device 44 to source a relatively larger difference in output current iout to the load to compensate for the transient spike in current demand.

In any case, it will be noted that the capacitances of the first and second capacitors C1 and C2 will be substantially smaller than the capacitance of the necessary filtering capacitor of the prior art solution. Such capacitors, with small capacitances, have a negligible impact on occupied surface area of the integrated circuit.

It will further be noted that the solution described herein for use of one or more switched capacitor circuits 54', 54, 56, obviates the need to increase quiescent current and thus provided for improved power consumption which is advantageous in battery powered and wirelessly powered circuit applications.

Figure 6:
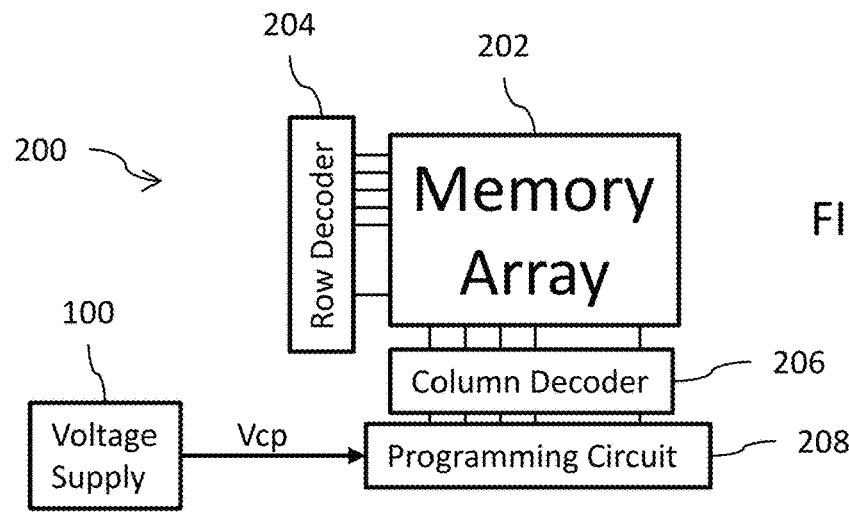
FIG. 6 which illustrates a memory device.

Reference is now made to FIG. 6 which illustrates a memory device 200 including a memory array 202, a row decoder circuit 204, a column decoder circuit 206 and a programming circuit 208. The memory array 202 is of the type which requires for one or more of the write operation or the erase operation the application of a relatively high control voltage to the memory cells within the array. For example, this may comprise, in the context of a resistive memory of the phase change type, the application of a high voltage when instigating a phase change to program a certain logic state in a cell. The memory device 200 may further include the voltage supply circuit 100 to provide the charge pump output voltage Vcp to the programming circuit 108.

Figure 7:
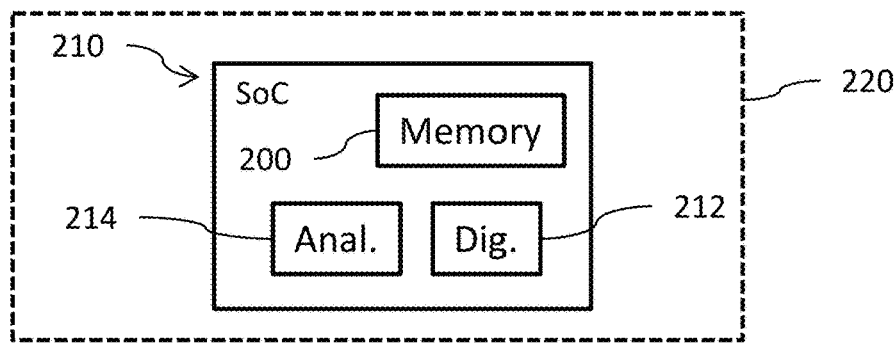
FIG. 7 illustrates an integrated system on chip (SoC) device.

With reference to FIG. 7, the memory device 200 may comprise an embedded memory within an integrated system on chip (SoC) device 210 including a digital circuit 212 (such as a microcontroller) and analog circuits 214. The SoC device 210 may, for example, be a circuit component of a consumer electronic device 220 such as a smart phone, tablet computer, personal computer, television, battery charging circuit, communications devices, etc. More generally, the consumer electronic device 220 may comprise a consumer device powered from a battery or powered wirelessly.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
    a voltage regulator circuit configured to receive a reference voltage and generate a regulated output voltage, said voltage regulator circuit including a field effect transistor (FET) device having a gate terminal configured to receive a control voltage and a drain terminal configured to source an output current for generating the regulated output voltage; and
    a charge pump circuit having an input configured to receive the regulated output voltage, an output configured to generate a pumped voltage, and a clock input configured to receive a clock signal, wherein pumping operation of said charge pump circuit is driven by opposite first and second logic states of the clock signal;
    wherein said voltage regulator circuit further includes a switched capacitor circuit coupled to the gate terminal and configured to selectively charge a capacitor with a charging current sunk from the gate terminal of the FET device in response to the first logic state of the clock signal and selectively discharge the capacitor in response to the second logic state of the clock signal.

2. The circuit of claim 1, wherein the charge pump circuit comprises a multi-stage capacitor circuit.

3. The circuit of claim 2, wherein a stage of the multi-stage capacitor circuit is implemented as a Dickson circuit.

4. The circuit of claim 2, wherein a stage of the multi-stage capacitor circuit is implemented as a voltage doubler circuit.

5. The circuit of claim 1, wherein the switched capacitor circuit further comprises a voltage limiting circuit coupled in series with the capacitor between the gate terminal and a ground.

6. The circuit of claim 5, wherein the voltage limiting circuit comprises a FET device having a gate terminal biased by a bias voltage.

7. The circuit of claim 1, wherein the voltage regulator circuit is a low drop out (LDO) type circuit.

8. The circuit of claim 1, wherein the switched capacitor circuit further comprises:
    a first transistor switch coupled in series with the capacitor between in the gate terminal of the MOSFET device and ground, said first transistor switch actuated to a closed state in response to the first logic state of the clock signal and actuated to an open state in response to the second logic state of the clock signal; and
    a second transistor switch coupled in parallel with the capacitor, said second transistor switch actuated to an open state in response to the first logic state of the clock signal and actuated to a closed state in response to the second logic state of the clock signal.

* * * * *